United States Patent
Huang (10) Patent No.: US 7,446,578 B2
(45) Date of Patent: Nov. 4, 2008

(54) SPREAD SPECTRUM CLOCK GENERATOR

(75) Inventor: Hsien-Sheng Huang, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 37 days.

(21) Appl. No.: 11/758,012

(22) Filed: Jun. 5, 2007

(65) Prior Publication Data
US 2008/0231333 A1    Sep. 25, 2008

(30) Foreign Application Priority Data
Mar. 20, 2007  (TW) .............................. 96109624 A (51) Int. Cl.
*H03L 7/06* (2006.01)

(52) U.S. Cl. ..................... 327/156; 327/147; 327/151; 327/152; 327/160; 327/163; 375/375; 375/376

(58) Field of Classification Search ................ 327/147, 327/151, 152, 156, 160, 163; 375/375, 376
See application file for complete search history.

(56) References Cited

U.S. PATENT DOCUMENTS

| | | | | |
|---|---|---|---|---|
| 5,287,389 A * | 2/1994 | Ichibangase et al. | ........ | 375/365 |
| 5,638,028 A * | 6/1997 | Voth | ............................. | 331/25 |
| 5,737,373 A * | 4/1998 | Sato et al. | .................... | 375/376 |
| 6,294,936 B1 | 9/2001 | Clementi | | |
| 6,366,174 B1 * | 4/2002 | Berry et al. | .................... | 331/78 |
| 6,850,554 B1 * | 2/2005 | Sha et al. | ..................... | 375/140 |
| 6,943,598 B2 * | 9/2005 | Ghazali et al. | ............... | 327/147 |
| 7,078,947 B2 * | 7/2006 | Loh | ............................ | 327/156 |
| 7,224,720 B2 * | 5/2007 | Oishi et al. | .................. | 375/150 |
| 7,233,210 B2 * | 6/2007 | Kaizuka | ....................... | 331/1 A |
| 7,236,057 B2 * | 6/2007 | Kaizuka | ....................... | 331/1 A |
| 7,283,002 B2 * | 10/2007 | Puma et al. | .................... | 331/16 |
| 7,336,752 B2 * | 2/2008 | Vlasenko et al. | ............. | 375/376 |
| 7,356,111 B1 * | 4/2008 | Dean | ........................... | 375/376 |
| 7,388,412 B2 * | 6/2008 | Jung | ........................... | 327/116 |
| 7,394,884 B2 * | 7/2008 | Kaylani et al. | ............... | 375/372 |
| 2004/0125905 A1 * | 7/2004 | Vlasenko et al. | ............. | 375/376 |
| 2004/0212412 A1 * | 10/2004 | Saeki | .......................... | 327/156 |
| 2005/0134335 A1 * | 6/2005 | Loh | ............................. | 327/156 |
| 2005/0180490 A1 * | 8/2005 | Hattori | ........................ | 375/130 |
| 2005/0242851 A1 * | 11/2005 | Booth et al. | .................. | 327/156 |
| 2005/0281367 A1 * | 12/2005 | Lesso | .......................... | 375/376 |
| 2006/0056564 A1 * | 3/2006 | Takeuchi | ...................... | 375/376 |
| 2006/0210006 A1 * | 9/2006 | Sareen | ......................... | 375/376 |
| 2006/0245531 A1 * | 11/2006 | Leonowich et al. | ......... | 375/376 |
| 2007/0041486 A1 * | 2/2007 | Shin | ............................. | 375/376 |

OTHER PUBLICATIONS

Circuits for High Speed Links and Clock Generators, A Low-Jitter 5000 PPM Spread Spectrum Clock Generator for Multi-Channel SATA Transceiver in 0.18 UM COMS, Feb. 8, 2005, p. 590, ISSCC2005 Session 8, ISSCC.

* cited by examiner

*Primary Examiner*—Lincoln Donovan
*Assistant Examiner*—Adam Houston
(74) *Attorney, Agent, or Firm*—Winston Hsu (57) ABSTRACT

A spread spectrum clock generator is disclosed. The spread spectrum clock generator (SSCG) bases on the structure of the phase-lock loop. The SSCG uses the voltage control oscillator with multi-phase output function for outputting clock signals of different phases. The clock signals of different phases are selectively fed back to the phase frequency detector. In this way, the frequency of the output signal is changed, which achieves spreading spectrum.

20 Claims, 8 Drawing Sheets

SPREAD SPECTRUM CLOCK GENERATOR

BACKGROUND OF THE INVENTION

1. Field of the Invention

The present invention relates to a clock generator, and more particularly, to a spread spectrum clock generator.

2. Description of the Prior Art

Figure 1:
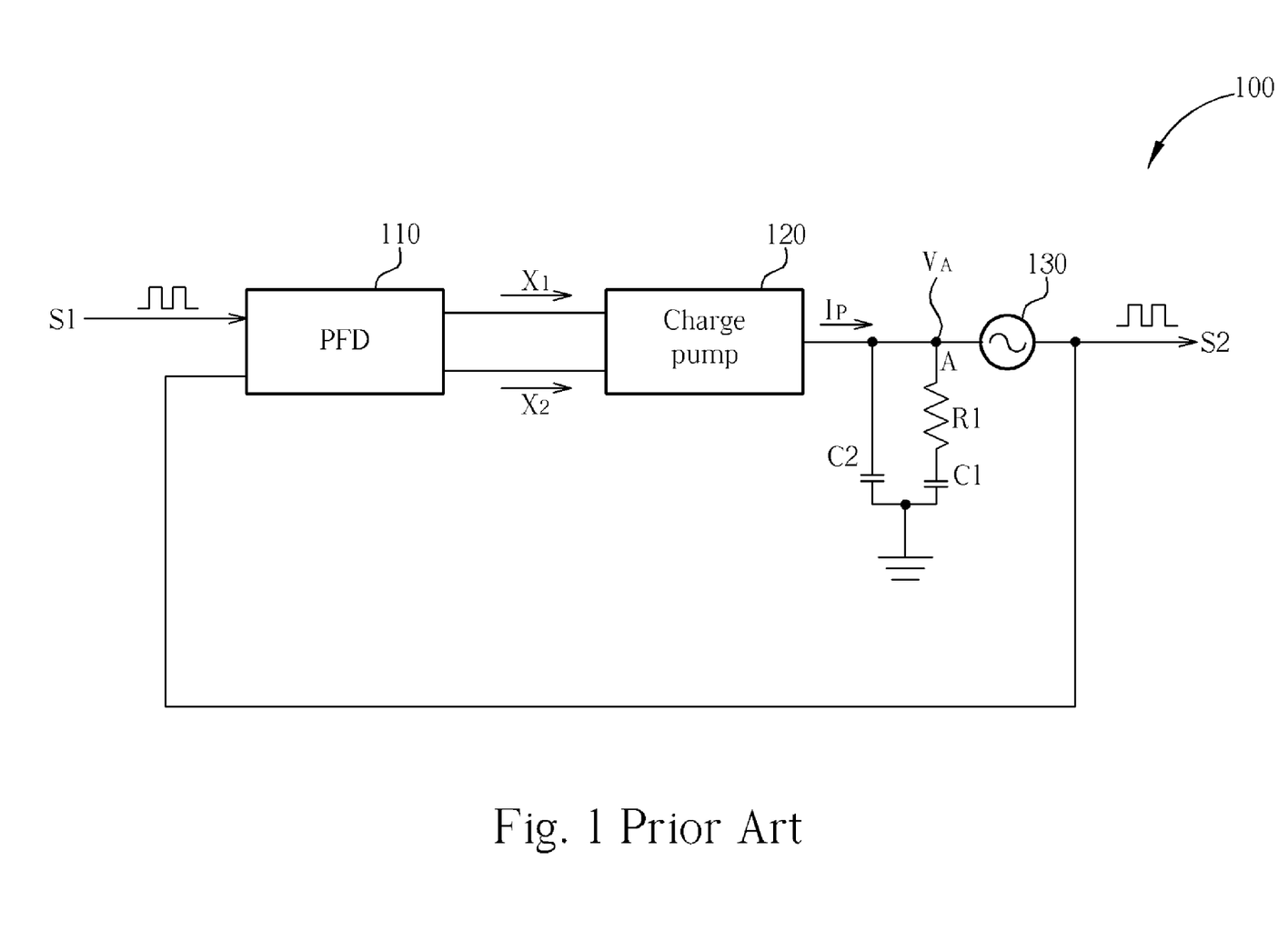
FIG. 1 is a diagram illustrating a conventional PLL.

Please refer to FIG. 1. FIG. 1 is a diagram illustrating a conventional Phase Lock Loop (PLL) 100. As shown in FIG. 1, the PLL 100 comprises a Phase/Frequency Detector (PFD) 110, a charge pump 120, two capacitors C1 and C2, a resistor R1, and a Voltage Control Oscillator (VCO) 130. The PLL 100 receives a clock signal S1 and accordingly generates a clock signal S2. The phase and frequency of the signal S2 is the same as those of the signal S1. The PFD 110 comprises two input ends and an output end. One input end of the PFD 110 receives the clock signal S1 and the other input end of the PFD 110 receives the signal S2 fed back from the output end of the PFD 110. The PFD 110 transmits the control signals X1 or X2 to the charge pump 120 according to the phase difference and the frequency difference between the signals S1 and S2. When the frequency/phase of the signal S2 is higher than that of the signal S1, the PFD 110 transmits the control signal X1. When the frequency/phase of the signal S2 is lower than that of the signal S1, the PFD 110 transmits the control signal X2. When the frequency/phase of the signal S2 is the same as that of the signal S1, the PFD 110 does not transmit the control signals X1 or X2. The input end of the charge pump 120 is coupled to the output end of the PFD 110 for receiving the control signals X1 or X2 and accordingly sourcing or sinking a current Ip with a constant value. That is, when receiving the control signal X1, the charge pump 120 sources the current Ip. When receiving the control signal X2, the charge pump 120 sinks the current Ip. When not receiving the control signals X1 or X2, the charge pump 120 does not source or sink the current Ip. The capacitor C2 is coupled between the output end of the charge pump 120 (node A) and a ground end. One end of the resistor R1 is coupled to the node A, and the other end of the resistor R1 is coupled to the capacitor C1. The capacitor C1 is coupled between the resistor R1 and the ground end. Thus, the voltage VA on the node A rises or falls as the charge pump 120 sources or sinks the current Ip. When the charge pump 120 keeps sourcing the current Ip, the voltage VA keeps rising as well. When the charge pump 120 keeps sinking the current Ip, the voltage VA keeps falling as well. The input end of the VCO 130 is coupled to the node A. The VCO 130 outputs the clock signal S2 having the frequency according to the voltage VA on the node A. When the voltage VA rises, the frequency of the signal S2 rises as well. When the voltage VA falls, the frequency of the signal S2 falls as well. The clock signal S2 is also fed back to the PFD 110. In this way, the conventional PLL 100 outputs an clock signal with the same frequency and the same phase as the input clock signal.

However, any electronic devices with high frequencies generate noises. The noises interfere with other electronic device through the power lines or air. Many countries have restriction on the degree the electronic device interference such as EN55015, FCC PART 18, and JIS. And because the conventional PLL 100 generates the clock signal S2 with concentrated power so that the power of the clock signal S2 possibly exceeds the restriction, causing interference with other electronic devices.

SUMMARY OF THE INVENTION

The present invention provides a Spread Spectrum Clock Generator (SSCG). The SSCG comprises a Phase/Frequency Detector (PFD) comprising a first input end for receiving an objective clock signal; a second input end for receiving a feedback clock signal; and an output end for selectively outputting a first control signal or a second control signal; a voltage controller coupled to the output end of the PFD for outputting a corresponding voltage according to the first control signal and the second control signal; a Voltage Control Oscillator (VCO) coupled to the output end of the voltage controller for outputting a plurality of clock signals; wherein the plurality of the clock signals have a same frequency according to the voltage output from the voltage controller; wherein phases of the plurality of the clock signals are different to each other; a multiplexer comprising a plurality of input ends, each input end receiving a corresponding clock signal from the plurality of the clock signals; a control end for receiving a third control signal; and an output end coupled to the second input end of the PFD; wherein the multiplexer couples one of the input ends of the multiplexer to the output end of the multiplexer for generating a combination clock signal according to the third control signal; a pattern generator comprising a first input end for receiving a second reference clock signal; a second input end for receiving the combination clock signal; and an output end coupled to the control end of the multiplexer for outputting the third control signal; and a counter coupled to the output end of the multiplexer for counting the number of cycles of the combination clock signal; wherein the pattern generator controls one of the plurality of the input ends of the multiplexer to couple to the output end of the multiplexer according to the second reference clock signal, the combination clock signal, and the number of the counter.

The present invention further provides a SSCG. The SSCG comprises a first frequency divider for receiving an objective clock signal and dividing the objective clock signal; a PFD comprising a first input end coupled to the first frequency divider for receiving the divided objective clock signal; a second input end for receiving a feedback clock signal; a first output end for outputting a first control signal; and a second output end for outputting a second control signal; wherein the PFD outputs the first and the second control signals according to a phase difference and a frequency difference between the divided objective clock signal and the feedback clock signal; a voltage controller coupled to the output end of the PFD for outputting a corresponding voltage according to the first and the second control signals; a VCO coupled to the output end of the voltage controller for outputting a plurality of clock signals; wherein the plurality of the clock signals have a same frequency according to the voltage output from the voltage controller; wherein phases of the plurality of the clock signals are different to each other; a multiplexer comprising a plurality of input ends, each input end for receiving a corresponding clock signal from the plurality of the clock signals; a control end for receiving a third control signal; and an output end coupled to the second input end of the PFD; wherein the multiplexer couples one of the plurality of the input ends of the multiplexer to the output end of the multiplexer for generating a combination clock signal according to the third control signal; a pattern generator comprising a first input end for receiving a reference clock signal; a second input end for receiving the combination clock signal; a counter coupled to the output end of the multiplexer for counting number of cycles of the combination clock signal; and an output end coupled to the control end of the multiplexer for outputting the third control signal; wherein the pattern generator outputs the third control signal according to the combination clock signal, the number of the counter, and the reference clock signal.

The present invention further provides a SSCG. The SSCG comprises a PFD for receiving an objective clock signal and a feedback clock signal and selectively outputting a first control signal or a second control signal; a voltage controller for outputting a corresponding voltage according to the first control signal or the second control signal; a VCO for outputting a plurality of clock signals according to the voltage output from the voltage controller; wherein phases of the clock signals are different to each other; a multiplexer for selectively outputting one of the plurality of clock signals to generate a combination clock signal; and a pattern generator for outputting a third control signal according to a reference clock signal and the combination clock signal; wherein the SSCG selectively outputs a first clock signal of the plurality of the clock signals.

The present invention further provides a SSCG for generating a spread spectrum clock signal. The SSCG comprises a VCO for outputting a plurality of clock signals according to a variable voltage; wherein phases of the plurality of the clock signals are different to each other; a multiplexer for selectively outputting one of the plurality of the clock signals for generating a combination clock signal; and a pattern generator for outputting a third control signal according to a reference clock signal and the combination clock signal; wherein the SSCG selectively outputs a first clock signal of the plurality of the clock signals.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
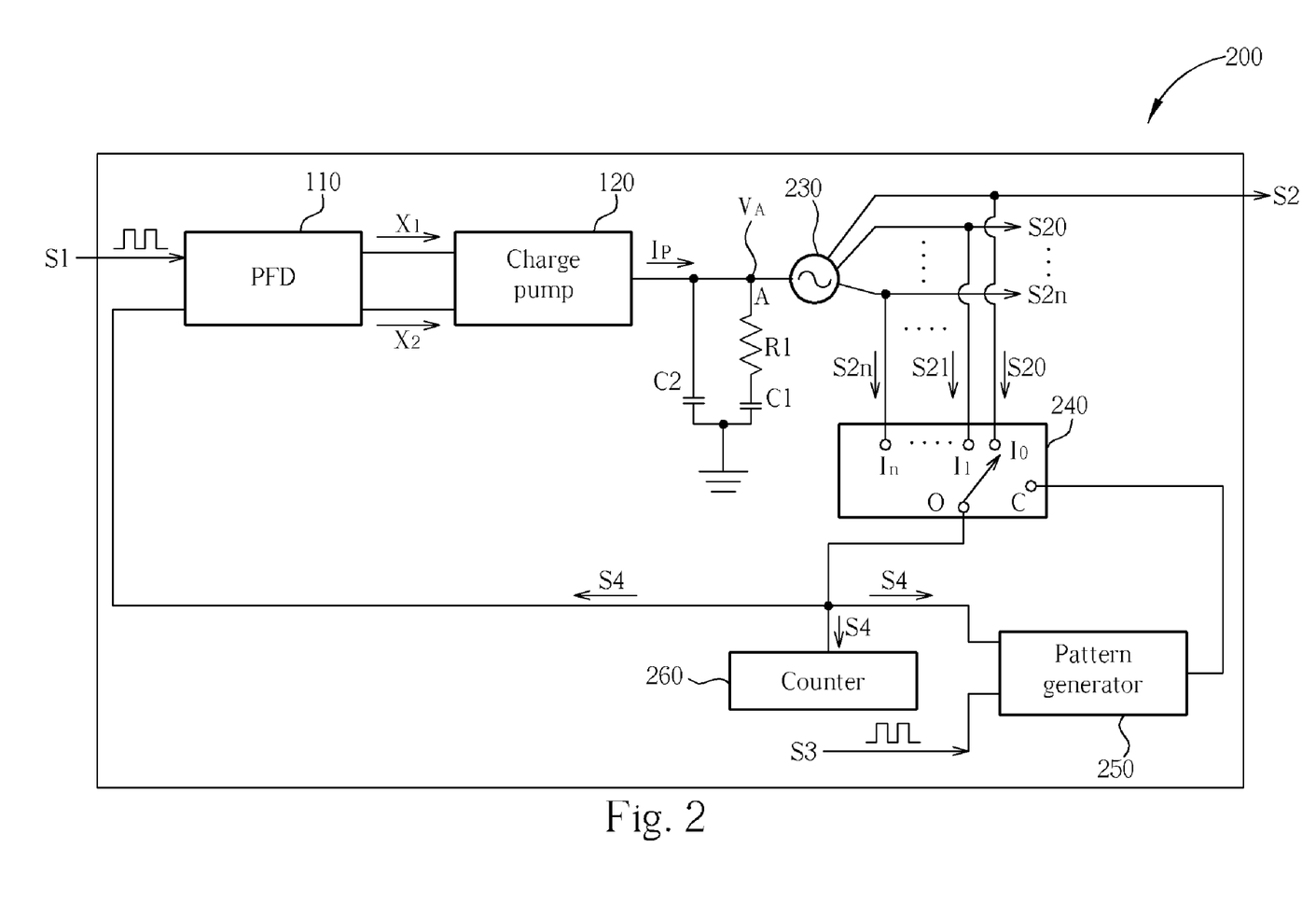
FIG. 2 is a SSCG according to a first embodiment of the present invention.
Figure 5:
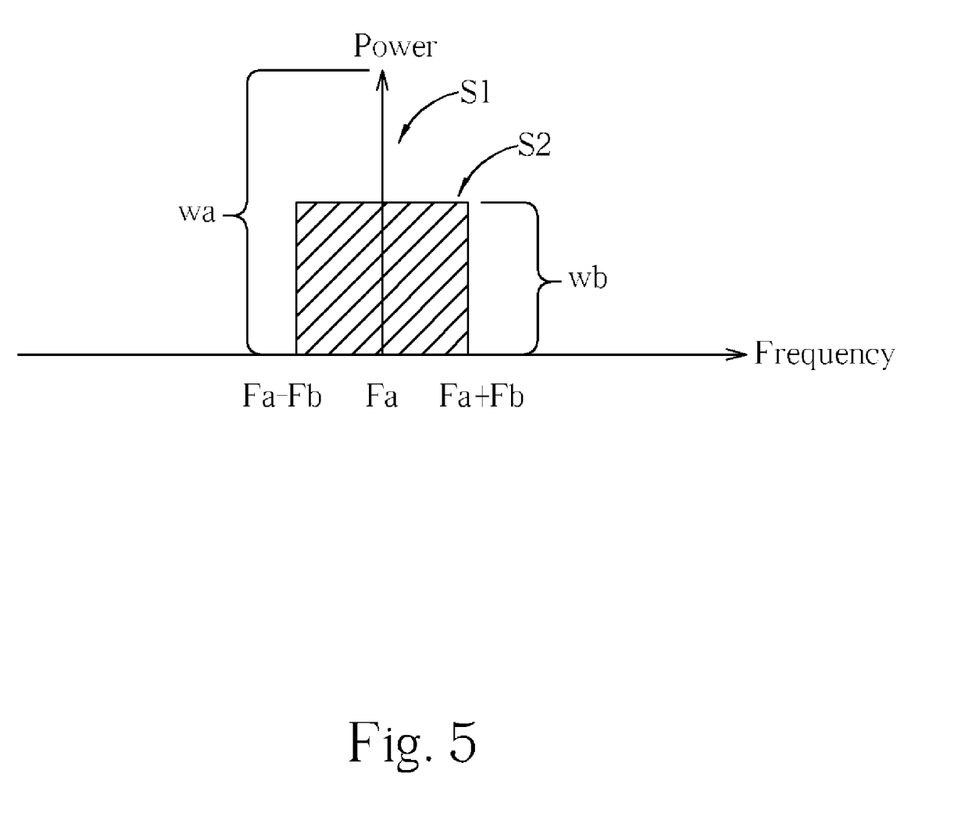
FIG. 5 is a diagram illustrating the spectrum of the signals.

Please refer to FIG. 2 and FIG. 5. FIG. 2 is a Spread Spectrum Clock Generator (SSCG) 200 according to a first embodiment of the present invention. FIG. 5 is a diagram illustrating the spectrum of the signals S1 and S2. The clock signal S1 is shown as the arrow in FIG. 5 of which the center frequency is Fa and the power is Wa. The clock signal S2 is shown as the shadow area in FIG. 5 of which the center frequency is Fa, spread frequency is Fb, and average power is Wb. It can be seen that the average power of the clock signal S2 is much lower than the power of the clock signal S1. In this way, the possibility of the signal S2 exceeding the restriction is reduced. As shown in FIG. 2, the SSCG 200 comprises a PHD 110, a charge pump 120, a loop filter (realized with two capacitors C1 and C2, and a resistor R1 according to the first embodiment of the present invention), a VCO 230, a multiplexer 240, a pattern generator 250, and a counter 260. The charge pump and the loop filter compose a voltage controller. The SSCG 200 receives a clock signal S1 and accordingly generates a clock signal S2. The center frequency of the clock signal S2 is the same as the frequency of the clock signal S1 but the power of the frequency of the clock signal S2 is spread (as shown in FIG. 5). The PFD 110 comprises two input ends and an output end. One input end of the PFD 110 receives the clock signal S1 and the other input end of the PFD 110 receives a feedback clock signal S4. The output end of the PFD 110 outputs the control signals X1 or X2 to the charge pump 120 according to the frequency difference and the phase difference between the clock signals S1 and S4. When the frequency/phase of the clock signal S4 is higher than frequency/phase of the clock signal S4, the PFD 110 transmits the control signal X1. When the frequency/phase of the clock signal S4 is lower than the frequency/phase of the clock signal S1, the PFD 110 transmits the control signal X2. When the frequency/phase of the clock signal S4 is the same as the frequency/phase of the clock signal S4, the PFD 110 does not transmit the control signals X1 or X2. The input end of the charge pump 120 is coupled to the output end of the PFD 110 for receiving the control signals X1 or X2 and accordingly sourcing or sinking the current Ip with a constant size. That is, when the charge pump 120 receives the control signal X1, the charge pump 120 sources the current Ip, and when the charge pump 120 receives the control signal X2, the charge pump 120 sinks the current Ip. In the present embodiment, the capacitor C2 of the loop filter is coupled between the output end of the charge pump 120 (node A) and a ground end. One end of the resistor R1 is coupled to the node A and the other end of the resistor R1 is coupled to the capacitor C1. The capacitor C1 is coupled between the resistor R1 and the ground end. Thus, the voltage VA on the node A rises/falls as the charge pump 120 sources/sinks the current Ip. When the charge pump 120 keeps sourcing the current Ip, the voltage VA keeps rising. When the charge pump 120 keeps sinking the current Ip, the voltage VA keeps falling. The input end of the VCO is coupled to the node A and outputs clock signals S20-S2n with corresponding frequency according to the voltage VA on the node A. In the present embodiment, the clock signal S20 serves as the output clock signal S2 but any one of the other clock signals S21-S2n is also fine to serves as the output clock signal S2. In the present embodiment, the clock signals S20-S2n divide the 360 degree phase into equal parts. For example, when the VCO 230 outputs 4 clock signals S20-S23, it means the clock signal S21 is behind the clock signal S20 by 90 degree, the clock signal S22 is behind the clock signal S21 by 90 degree, and so on. When the voltage VA rises, the frequencies of the clock signals S20-S2n rise as well. When the voltage VA falls, the frequencies of the clock signals S20-S2n fall as well. The multiplexer 240 comprises n input ends I0-In respectively coupled to the corresponding output end of the VCO 230 for receiving the clock signals S20-S2n, a control end C coupled to the pattern generator 250, and an output end O coupled to the input end of the PFD 110 and the input end of the counter 260. The multiplexer 240 couples one input end of the multiplexer 240 to the output end O of the multiplexer 240 according to the control signal transmitted from the pattern generator 250. For example, when the pattern generator 250 transmits the control signal demanding the multiplexer 240 coupling the second input end I2 to the output end O, the multiplexer 240 accordingly couples the second input end I2 to the output end O. In this manner the clock signal S22 is transmitted to the counter 260 and the PFD 110 through the multiplexer 240. The signal transmitted by the multiplexer 240 is the clock signal S4. The clock signal S4 is not limited to be only one of the clock signals S20-S2n. The clock signal S4 can be the combination of the signals S20-s2n and is decided by the pattern generator 250. The counter 260 is coupled to the output end O of the multiplexer 240 for counting the amount of the cycles that the clock signal S4 passes by (the number of cycles is not defined by the same period but the number of rising edges or the falling edges). For example, when the clock signal S4 has a rising edge, triggering the counter 260, the counter 260 counts for 1. Thus, when the clock signal S4 has n rising edges, the number that the counter 260 counts for (CT) is n. The pattern generator 250 comprises two input ends respectively coupled to the output end O of the multiplexer 240 and an oscillator (not shown in the figure) for receiving the clock signal S4 from the multiplexer 240 and the clock signal S3 from the oscillator. The pattern generator 250 controls the internal coupling of the multiplexer 240 according to the number CT of the counter 260, the clock signals S3 and S4, which affects the combination of the clock signal S4. Further, the clock signal S3 serves as a reference clock that the frequency of the clock signal S4 oscillates with and thus the clock signal S4 with spread spectrum is fed back to the PFD 110. In this way, the frequency of the output clock signal S2 is spread.

Figure 6:
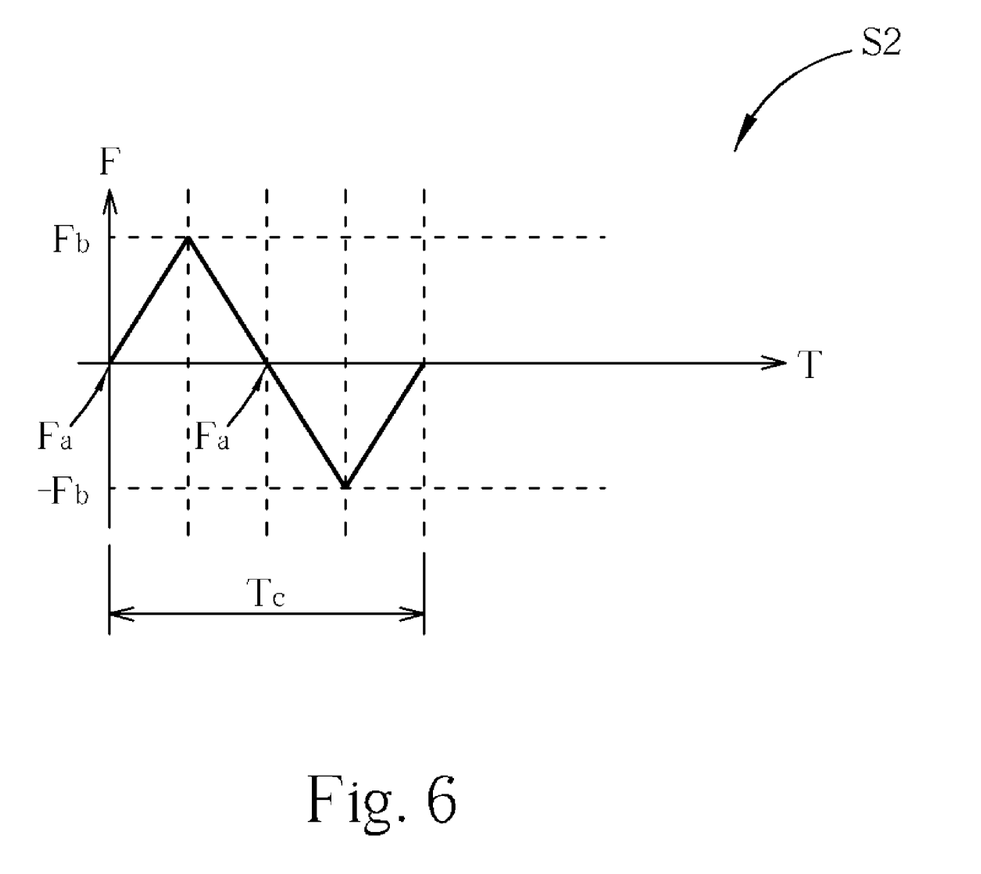
FIG. 6 is a diagram illustrating the clock signal having the spread spectrum.

Please refer to FIG. 6. FIG. 6 is a diagram illustrating the clock signal S2 having the spread spectrum. According to an embodiment of the present invention, triangle-spreading the frequency is employed for spreading the frequency of the signal S2. The center frequency of the clock signal S2 is Fa, the highest frequency of the clock signal S2 is (Fa+Fb), and the lowest frequency of the clock signal S2 is (Fa−Fb). The frequency of the clock signal S2 rises with a constant velocity and the periods between the frequencies rises from Fa, to the top (Fa+Fb), down the bottom (Fa−Fb), and back to the Fa is Tc. And the period Tc is the period of the clock signal S3.

Figure 3:
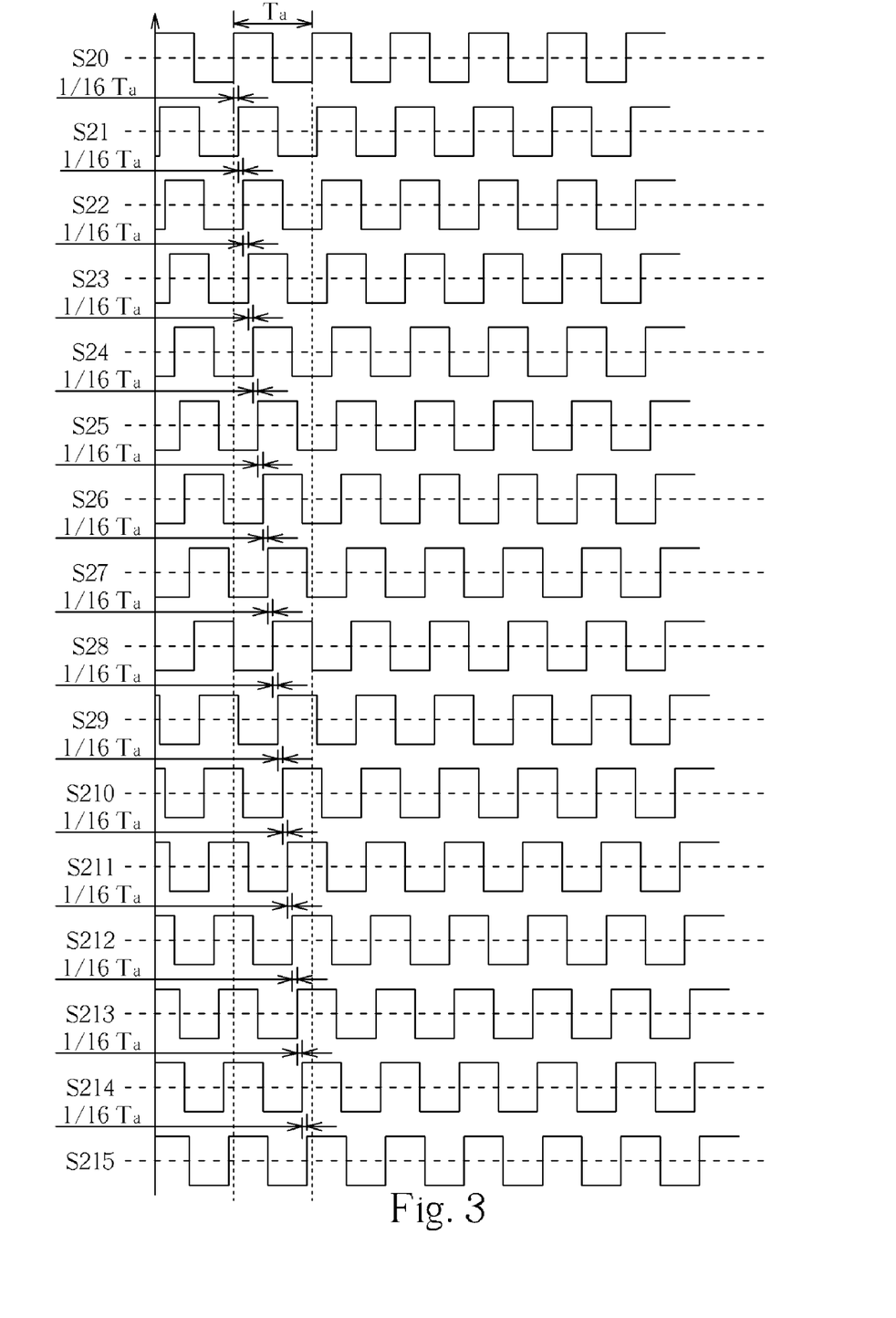
FIG. 3 is a diagram illustrating clock signals generated by the SSCG according to an embodiment of the present invention.

Please refer to FIG. 3. FIG. 3 is a diagram illustrating clock signals S20-S2n generated by the SSCG according to an embodiment of the present invention. In the present embodiment, n=16 is taken as an example as the signals S20-S215 shown in FIG. 3. In FIG. 3, each clock signal is behind the previous clock signal by (Ta/16) of the phase/period. That is, the clock signal S21 is behind the clock signal S20 by Ta/16, the clock signal S22 is behind the clock signal S20 by 2Ta/16, and so on. Additionally, the clock signals behind the clock signal S28 are determined for being ahead of the clock signal S20. For example, the clock signal S29 is ahead of the clock signal S20 by Ta/16, the clock signal S210 is ahead of the clock signal S20 by 2Ta/16, and so on.

Figure 4:
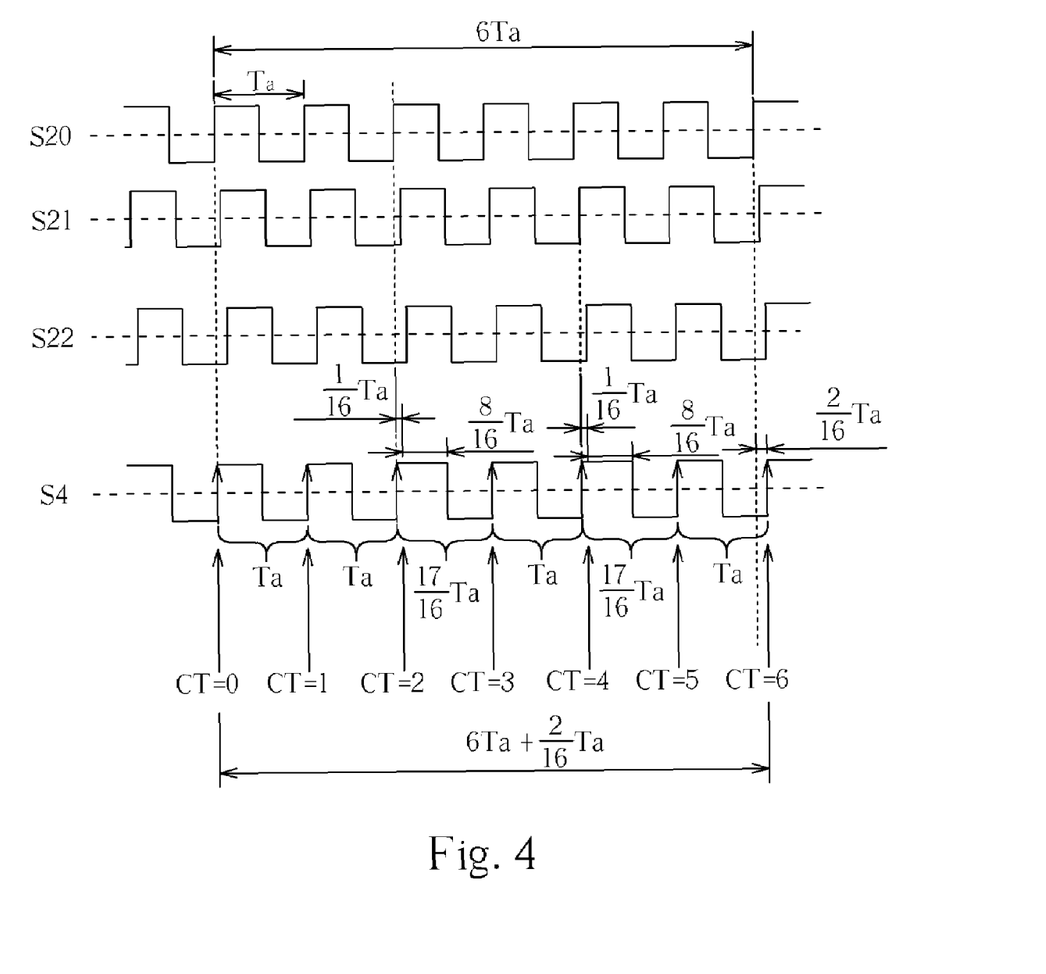
FIG. 4 is a diagram illustrating the combination of the clock signal according to an embodiment of the present invention.

Please refer to FIG. 4. FIG. 4 is a diagram illustrating the combination of the clock signal S4 according to an embodiment of the present invention. In default status, the pattern generator 250 controls the multiplexer 240 to couple the input end I0 to the output end O. That is, the clock signal S4 is S20 in default. The counter 260 is set to be reset at CT=6, meaning that CT=0, 1, 2, 3, 4, 5, and 6 for cycling. The condition of the pattern generator 250 is: When CT=2 and the clock signals S20 and S21 are both high or low, control the output end O of the multiplexer 240 to the input end I1 of the multiplexer 240; when CT=4 and the clock signals S21 and S22 are both high or low, control the output end O of the multiplexer 240 to the input end I2 of the multiplexer 240. In this way, the clock signal S4 is generated as shown in FIG. 4. At CT=2, the first half period of the clock signal S4 is high for [(1/16)Ta+(8/16)Ta] where the part (1/16)Ta is contributed by the clock signal S20, and then the multiplexer 240 switches the output end O to the input end I1 and thus the part (8/16)Ta is contributed by the clock signal S21. In this way, in the period of CT=2 to CT=4, the period of time is (2+(1/16))Ta. At CT=4, it is seen that the first half period of the clock signal S4 is high for [(1/16)Ta+(8/16)Ta]: the part (1/16)Ta is contributed by the clock signal S21, and then the multiplexer 240 switches the output end O to the input end I2 and thus the part (8/16)Ta is contributed by the clock signal S22. The clock signal S20 takes 6Ta for having 6 rising edges while the clock signal S4 takes [6+(2/16)] Ta for having 6 rising edges. Thus, when the clock signal S4 is fed back to the PFD 110, the PFD 110 determines that the frequency is too low and accordingly rises the frequency of the VCO 230. Consequently, the frequency of the clock signals S20-S216 are raised.

Figure 7:
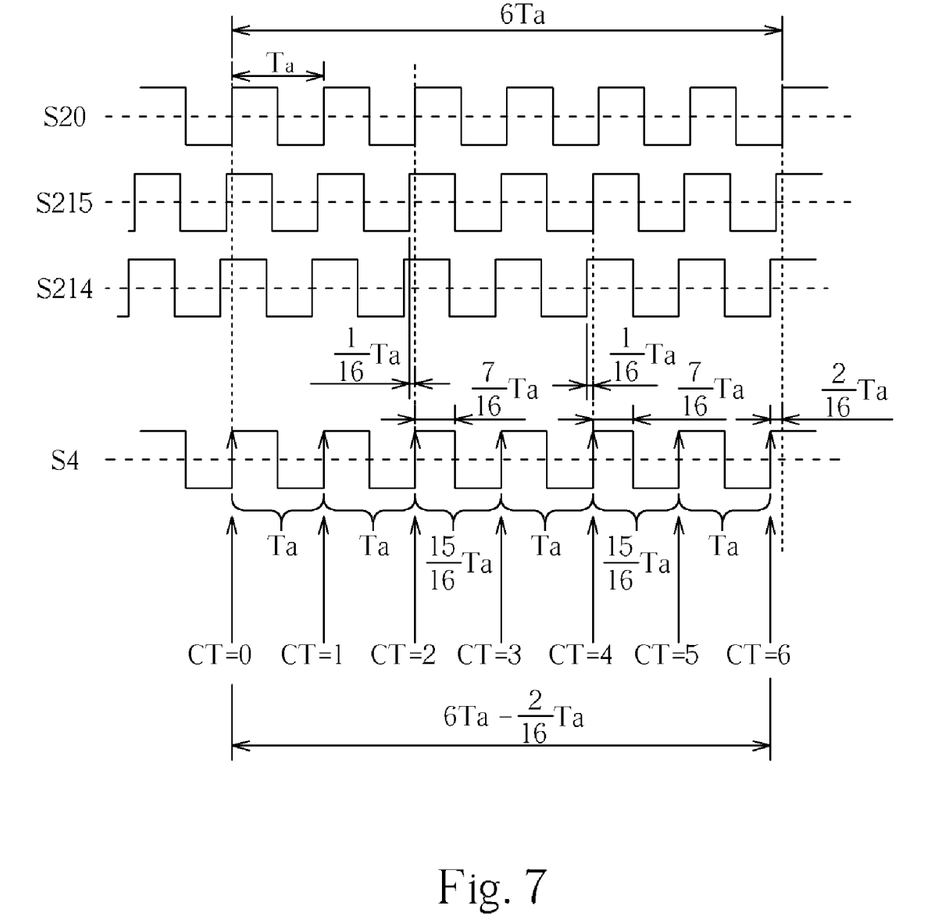
FIG. 7 is diagram illustrating the combination of the clock signal according to another embodiment of the present invention.

Please refer to FIG. 7. FIG. 7 is diagram illustrating the combination of the clock signal S4 according to another embodiment of the present invention. In default, the pattern generator 250 controls the multiplexer 240 to couple the input end I0 to the output end O. That is, the clock signal S4 is S20 in default. The counter 260 is set to be reset at CT=6, meaning that CT=0, 1, 2, 3, 4, 5, and 6 for cycling. The condition of the pattern generator 250 is: When CT=2 and the clock signals S20 and S215 are both high or low, control the output end O of the multiplexer 240 to the input end I15 of the multiplexer 240; when CT=4 and the clock signals S215 and S214 are both high or low, control the output end O of the multiplexer 240 to the input end I14 of the multiplexer 240. In this way, the clock signal S4 is generated as shown in FIG. 7. At CT=2, the first half period of the clock signal S4 is high for [(8/16)Ta−(1/16)Ta=(7/16)Ta]: because the clock signals S20 and S215 are the same high or same low and thus the multiplexer 240 switches the output end O to the input end I15 and thus the part (7/16)Ta is contributed by the clock signal S215. In this way, in the period of CT=2 to CT=4, the period of time is (2−(1/16))Ta. At CT=4, it is seen that the first half period of the clock signal S4 is high for [(8/16)Ta−(1/16)Ta=(7/16)Ta]: because the clock signals S215 and S214 are the same high or same low and thus the multiplexer 240 switches the output end O to the input end I14 and thus the part (7/16)Ta is contributed by the clock signal S214. Thus, the period of Ct=4 to CT=6 is [2−(1/16)]Ta. The clock signal S20 takes 6Ta for having 6 rising edges while the clock signal S4 takes [6−(2/16)] Ta for having 6 rising edges. Thus, when the clock signal S4 is fed back to the PFD 110, the PFD 110 determines that the frequency is too high and accordingly decreases the frequency of the VCO 230. Consequently, the frequency of the clock signals S20-S216 are lowered.

Thus, according to FIG. 4 and FIG. 7, the SSCG 200 of the present invention provides programmable settings so as to spread the frequency of the clock signal S4 regularly and periodically for controlling the output frequency of the VCO 230, and achieve the result of spreading frequency.

Figure 8:
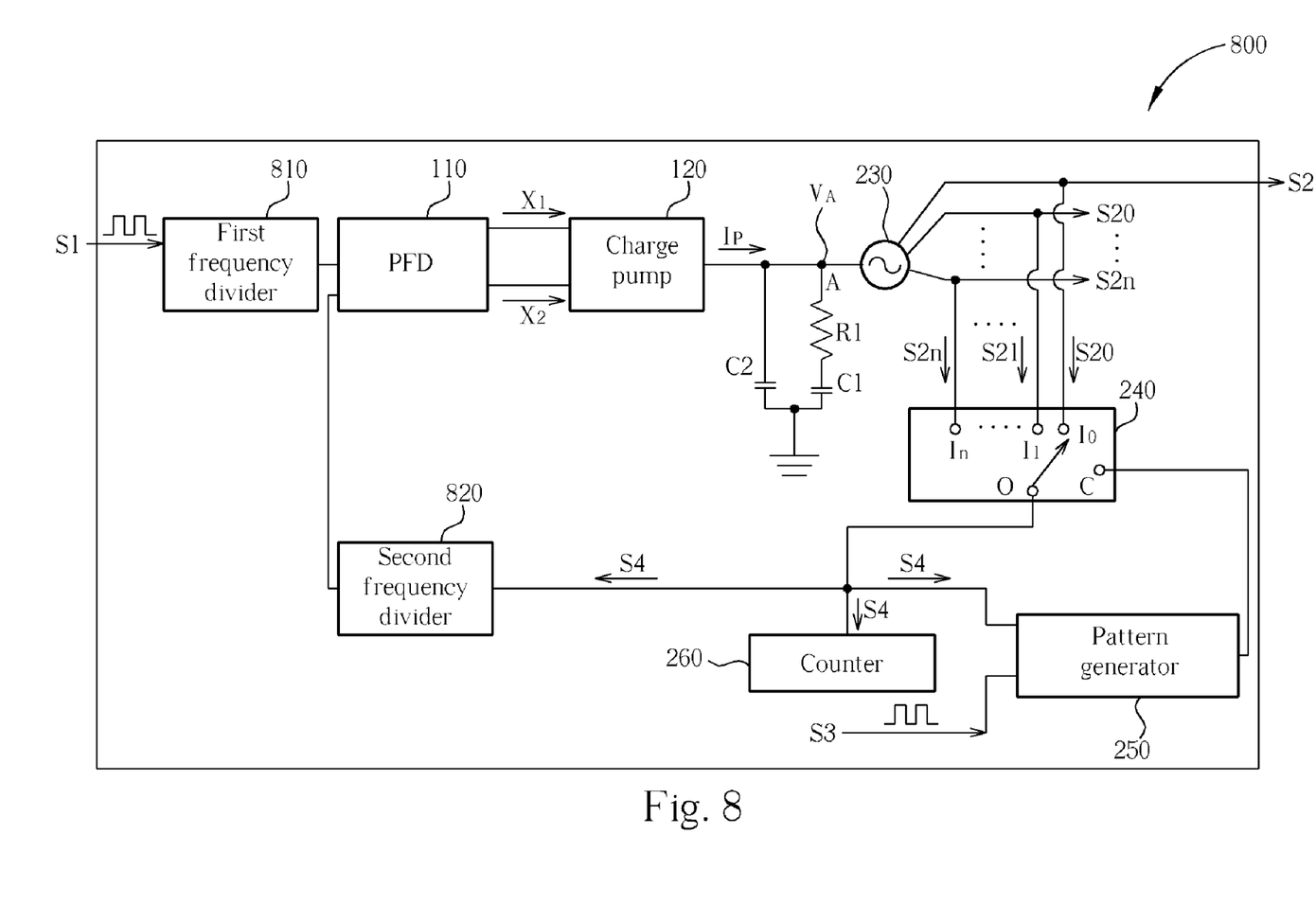
FIG. 8 is a diagram illustrating the SSCG according to a second embodiment of the present invention.

Please refer to FIG. 8. FIG. 8 is a diagram illustrating the SSCG 800 according to a second embodiment of the present invention. The components in FIG. 8 are similar to those in FIG. 2, and the related description is omitted. The difference between FIG. 8 and FIG. 2 is the SSCG 800 further comprises a first frequency divider 810 coupled to the first input end of the PFD 110 for dividing the frequency with C and a second frequency divider 820 coupled to the second input end of the PFD 110 for dividing the frequency with D. Consequently, to sum the result caused by the frequency dividers 810 and 820, the final center frequency output is (D/C) times of the original frequency, which is useful.

Those skilled in the art will readily observe that numerous modifications and alterations of the device and method may be made while retaining the teachings of the invention.

What is claimed is:

1. A Spread Spectrum Clock Generator (SSCG) comprising:
    a Phase/Frequency Detector (PFD) comprising:
        a first input end for receiving an objective clock signal;
        a second input end for receiving a feedback clock signal; and
        an output end for selectively outputting a first control signal or a second control signal;
    a voltage controller coupled to the output end of the PFD for outputting a corresponding voltage according to the first control signal and the second control signal;
    a Voltage Control Oscillator (VCO) coupled to the output end of the voltage controller for outputting a plurality of clock signals;
        wherein the plurality of the clock signals have a same frequency according to the voltage output from the voltage controller;
        wherein phases of the plurality of the clock signals are different to each other;
    a multiplexer comprising:
        a plurality of input ends, each input end receiving a corresponding clock signal from the plurality of the clock signals;
        a control end for receiving a third control signal; and
        an output end coupled to the second input end of the PFD;
        wherein the multiplexer couples one of the input ends of the multiplexer to the output end of the multiplexer for generating a combination clock signal according to the third control signal;
    a pattern generator comprising:
        a first input end for receiving a second reference clock signal;
        a second input end for receiving the combination clock signal; and
        an output end coupled to the control end of the multiplexer for outputting the third control signal; and
    a counter coupled to the output end of the multiplexer for counting the number of cycles of the combination clock signal;
        wherein the pattern generator controls one of the plurality of the input ends of the multiplexer to couple to the output end of the multiplexer according to the second reference clock signal, the combination clock signal, and the number of the counter.

2. The SSCG of claim 1 wherein the voltage controller comprises:
    a charge pump comprising:
        an input end coupled to the first output end and the second output end of the PFD;
        an output end coupled to the input end of the VCO;
        wherein the charge pump outputs a current with a predetermined size through the output end of the charge pump according to the first control signal or the second control signal; and
    a charging circuit coupled to the output end of the charge pump, the charging circuit comprising:
        a first capacitor coupled between the output end of the charge pump and a ground end;
        a resistor coupled to the output end of the charge pump; and
        a second capacitor coupled between the resistor and the ground end.

3. The SSCG of claim 1 further comprising a first frequency divider coupled to the first end of the PFD for dividing an external clock signal to generate the objective clock signal.

4. The SSCG of claim 3 further comprising a second frequency divider coupled between the second input end of the PFD and the output end of the multiplexer.

5. The SSCG of claim 1 further comprising a second frequency divider coupled between the second input end of the PFD and the output end of the multiplexer.

6. The SSCG of claim 1 wherein the counter increases the number of cycles of the combination clock signal according to a number of rising edges of the combination clock signal.

7. A SSCG comprising:
    a first frequency divider for receiving an objective clock signal and dividing the objective clock signal;
    a PFD comprising:
        a first input end coupled to the first frequency divider for receiving the divided objective clock signal;
        a second input end for receiving a feedback clock signal;
        a first output end for outputting a first control signal; and
        a second output end for outputting a second control signal;
        wherein the PFD outputs the first and the second control signals according to a phase difference and a frequency difference between the divided objective clock signal and the feedback clock signal;
    a voltage controller coupled to the output end of the PFD for outputting a corresponding voltage according to the first and the second control signals;
    a VCO coupled to the output end of the voltage controller for outputting a plurality of clock signals;
        wherein the plurality of the clock signals have a same frequency according to the voltage output from the voltage controller;
        wherein phases of the plurality of the clock signals are different to each other;
    a multiplexer comprising:
        a plurality of input ends, each input end for receiving a corresponding clock signal from the plurality of the clock signals;
        a control end for receiving a third control signal; and
        an output end coupled to the second input end of the PFD;
        wherein the multiplexer couples one of the plurality of the input ends of the multiplexer to the output end of the multiplexer for generating a combination clock signal according to the third control signal;
    a pattern generator comprising:
        a first input end for receiving a reference clock signal;
        a second input end for receiving the combination clock signal;
        a counter coupled to the output end of the multiplexer for counting number of cycles of the combination clock signal; and
        an output end coupled to the control end of the multiplexer for outputting the third control signal;
        wherein the pattern generator outputs the third control signal according to the combination clock signal, the number of the counter, and the reference clock signal.

8. The SSCG of claim 7 wherein the voltage controller comprises:
    a charge pump comprising:

an input end coupled to the first output end and the second output end of the PFD;

an output end coupled to the input end of the VCO;

wherein the charge pump outputs a current with a predetermined size through the output end of the charge pump according to the first control signal or the second control signal; and a charging circuit coupled to the output end of the charge pump, the charging circuit comprising:

a first capacitor coupled between the output end of the charge pump and a ground end;

a resistor coupled to the output end of the charge pump; and a second capacitor coupled between the resistor and the ground end.

9. The SSCG of claim 7 further comprising a second frequency divider coupled between the second input end of the PFD and the output end of the multiplexer.

10. The SSCG of claim 7 wherein the counter increases the number of cycles of the combination clock signal according to a number of rising edges of the combination clock signal.

11. A SSCG comprising:

a PFD for receiving an objective clock signal and a feedback clock signal and selectively outputting a first control signal or a second control signal;

a voltage controller for outputting a corresponding voltage according to the first control signal or the second control signal;

a VCO for outputting a plurality of clock signals according to the voltage output from the voltage controller;

wherein phases of the clock signals are different to each other;

a multiplexer for selectively outputting one of the plurality of clock signals to generate a combination clock signal; and a pattern generator for outputting a third control signal according to a reference clock signal and the combination clock signal;

wherein the SSCG selectively outputs a first clock signal of the plurality of the clock signals.

12. The SSCG of claim 11 wherein frequencies of the plurality of the clock signals are the same.

13. The SSCG of claim 11 wherein the pattern generator outputs the third control signal according to a number of rising edges of the combination signal, the reference clock signal, and the combination clock signal.

14. The SSCG of claim 11 wherein the combination clock signal equals the feedback clock signal.

15. The SSCG of claim 11 further comprising a first frequency divider for dividing an external clock signal to generate the objective clock signal.

16. The SSCG of claim 15 further comprising a second frequency divider for dividing the combination clock signal to generate the feedback clock signal.

17. The SSCG of claim 11 wherein the voltage controller comprises:

a charge pump comprising:

an input end coupled to the first output end and the second output end of the PFD;

an output end coupled to the input end of the VCO;

wherein the charge pump outputs a current with a predetermined size through the output end of the charge pump according to the first control signal or the second control signal; and a charging circuit coupled to the output end of the charge pump, the charging circuit comprising:

a first capacitor coupled between the output end of the charge pump and a ground end;

a resistor coupled to the output end of the charge pump; and a second capacitor coupled between the resistor and the ground end.

18. A SSCG for generating a spread spectrum clock signal comprising:

a VCO for outputting a plurality of clock signals according to a variable voltage;

wherein phases of the plurality of the clock signals are different to each other;

a multiplexer for selectively outputting one of the plurality of the clock signals for generating a combination clock signal; and a pattern generator for outputting a third control signal according to a reference clock signal and the combination clock signal;

wherein the SSCG selectively outputs a first clock signal of the plurality of the clock signals.

19. The SSCG of claim 18 wherein frequencies of the plurality of the clock signals are the same.

20. The SSCG of claim 18 further comprising a loop for generating the variable voltage according to the combination clock signal.

* * * * *